United States Patent
Nishiuchi et al.

(10) Patent No.: US 12,144,162 B2
(45) Date of Patent: Nov. 12, 2024

(54) ELECTROMAGNETIC WAVE ABSORBER

(71) Applicant: HIROSE PAPER MFG CO., LTD., Kochi (JP)

(72) Inventors: Tomoya Nishiuchi, Kochi (JP); Yoshiki Mizuno, Kochi (JP)

(73) Assignee: HIROSE PAPER MFG CO., LTD., Kochi (JP)

( * ) Notice: Subject to any disclaimer, the term of this patent is extended or adjusted under 35 U.S.C. 154(b) by 198 days.

(21) Appl. No.: 18/002,702

(22) PCT Filed: Oct. 11, 2021

(86) PCT No.: PCT/JP2021/037506
§ 371 (c)(1),
(2) Date: Dec. 21, 2022

(87) PCT Pub. No.: WO2022/130752
PCT Pub. Date: Jun. 23, 2022

(65) Prior Publication Data
US 2023/0328943 A1    Oct. 12, 2023

(30) Foreign Application Priority Data
Dec. 16, 2020    (JP) .................................. 2020208144

(51) Int. Cl.
*H05K 9/00*    (2006.01)
(52) U.S. Cl.
CPC ........... *H05K 9/0088* (2013.01); *H05K 9/009* (2013.01)

(58) Field of Classification Search
CPC ............................ H05K 9/0088; H05K 9/009
See application file for complete search history.

(56) References Cited

U.S. PATENT DOCUMENTS 3,836,967 A * 9/1974 Wright ................. H01Q 17/008
                                                               342/4
6,784,419 B1 * 8/2004 Hayashi ............... H01Q 17/008
                                                               250/250

(Continued)

FOREIGN PATENT DOCUMENTS

JP              319300 A    1/1991
JP          200331984 A    1/2003

(Continued)

OTHER PUBLICATIONS

First Office Action issued in JP2020-208144 dated Aug. 23, 2024.
International Search Report issued in PCT/JP2021/037506 mailed Dec. 21, 2021.

*Primary Examiner* — Sherman Ng
(74) *Attorney, Agent, or Firm* — Nicholas Mesiti; Heslin Rothenberg Farley & Mesiti P.C.

(57) ABSTRACT

An object is to provide an electromagnetic wave absorber that has excellent performance in absorbing high-frequency electromagnetic waves of 60 GHz to 120 GHz incident thereon, and further has flexibility and can be installed on various curved surfaces. Conventional problems have been made solvable by an electromagnetic wave absorber that is a structure formed by folding a sheet 1 into the form of pleats, the sheet containing a conductive material and having a surface resistance of $10\Omega/\square$ to $10^4\Omega/\square$, in which slits 2 are perforated non-parallel to a folded ridgeline R.

9 Claims, 6 Drawing Sheets

(56) References Cited

U.S. PATENT DOCUMENTS

| | | | | |
|---|---|---|---|---|
| 7,695,803 B2* | 4/2010 | Kasabo | ................... | B32B 7/12 |
| | | | | 206/719 |
| 2013/0285846 A1* | 10/2013 | Kagawa | ............... | H05K 9/0086 |
| | | | | 342/1 |
| 2020/0015392 A1* | 1/2020 | Kagawa | ............... | H05K 9/0062 |
| 2020/0267877 A1* | 8/2020 | Hiroi | ................... | H05K 9/0088 |

FOREIGN PATENT DOCUMENTS

| | | | |
|---|---|---|---|
| JP | 2008141190 A | 6/2008 |
| JP | 2012186384 A | 9/2012 |
| JP | 2017157697 A | 9/2017 |
| JP | 6522262 B1 | 5/2019 |
| JP | 2020038879 A | 3/2020 |
| WO | 2020158692 A1 | 8/2020 |

* cited by examiner

ELECTROMAGNETIC WAVE ABSORBER

CROSS REFERENCE TO RELATED APPLICATIONS

This application is the National Phase filing under 35 U.S.C. § 371 of International Application No.: PCT/JP2021/037506, filed on Oct. 11, 2021, which claims priority to Japanese Application No.: 2020-208144 filed on Dec. 16, 2020. The contents of this prior application is hereby incorporated by reference herein in its entirety.

TECHNICAL FIELD

The present invention relates to an electromagnetic wave absorber that has flexibility and can be installed on a curved surface.

BACKGROUND ART

In recent years, electromagnetic waves in the range of submillimeter waves and millimeter waves having a frequency of 30 to 100 GHz have been used for information communication. In particular, millimeter waves of 60 to 90 GHz have been increasingly being used as radar frequencies for collision avoidance systems of automobiles. The millimeter-wave radar is installed in an automobile bumper and used to measure the distance from surrounding vehicles by transmitting millimeter waves and to adjust the distance between vehicles and the automobile speed. When the millimeter waves are diffusely reflected in the vicinity of the inside of the bumper, devices installed in the vicinity may malfunction, and hence it has been necessary to install an electromagnetic wave absorber in the body to absorb unnecessary electromagnetic waves.

For example, Patent Literature 1 discloses a λ/4 type electromagnetic wave absorber with a structure in which a metal layer is provided on the back surface of a sheet having magnetic, dielectric, and conductive properties to cancel out incident millimeter waves by utilizing the phase difference between incident millimeter waves and reflected millimeter waves.

Patent Literature 2 discloses an electromagnetic wave absorber with a structure in which a conductive sheet is folded in the form of pleats in order to improve oblique incidence characteristics, which is a problem of the λ/4 type. The electromagnetic wave absorber of Patent Literature 2 is characterized to have an angular structure obtained by pleating a sheet containing a conductive material, and has excellent absorption performance even at the time of oblique incidence because electromagnetic waves incident on the electromagnetic wave absorber are diffusely reflected inside the absorber.

CITATION LIST

Patent Literature

Patent Literature 1: Japanese Patent No. 6522262
Patent Literature 2: Japanese Patent Laid-Open No. 2008-141190

SUMMARY OF INVENTION

Technical Problem

However, there has been a problem with the electromagnetic wave absorber disclosed in Patent Literature 1 where the λ/4 type is unlikely to obtain a certain electromagnetic wave absorption effect for perpendicularly incident millimeter waves at a specific frequency.

Further, there has been a problem with the electromagnetic wave absorber disclosed in Patent Literature 2 where, with a structure being fixed, the folding is possible only in a specific direction such as the vertical direction, and it is thus difficult to install the electromagnetic wave absorber on a structure curved in a plurality of directions, for example.

Therefore, it is an object of the present invention to provide an electromagnetic wave absorber that has excellent performance in absorbing high-frequency electromagnetic waves of 60 GHz to 120 GHz incident thereon, and further has flexibility and can be installed on various curved surfaces.

Solution to Problem

That is, the electromagnetic wave absorber is an electromagnetic wave absorber being a structure formed by folding a sheet into the form of pleats, the sheet containing a conductive material and having a surface resistance of 10Ω/□ to 104Ω/□, in which slits are perforated non-parallel to a folded ridgeline.

The electromagnetic wave absorber according to [1] above, in which the slits are formed in a direction perpendicular or oblique to the ridgeline.

The electromagnetic wave absorber according to [1] or [2] above, in which the sheet has a thickness of 100 μm to 500 μm.

The electromagnetic wave absorber according to any one of [1] to [3] above, in which a height between the ridgeline formed on one surface of the sheet and the ridgeline formed on the other surface of the sheet on the opposite side is 0.5 mm to 15 mm, and a folding angle of the sheet is 10° to 45°.

The electromagnetic wave absorber according to any one of [1] to [4] above, in which a fiber contained in the sheet is at least one selected from vinylon fiber, polyester fiber, olefin fiber, and polyphenylene sulfide fiber.

The electromagnetic wave absorber according to any one of [1] to [5] above, in which the conductive material is at least one material selected from graphite, single-walled carbon nanotubes, multi-walled carbon nanotubes, graphene, and carbon fiber.

The electromagnetic wave absorber according to any one of [1] to [6] above, in which an adhesive layer made of an adhesive is provided on the other surface of the sheet.

Advantageous Effect of Invention

The electromagnetic wave absorber according to the present invention has excellent performance in absorbing high-frequency electromagnetic waves of 60 GHz to 120 GHz incident thereon, and further has flexibility and can be installed on various curved surfaces.

DESCRIPTION OF EMBODIMENTS

Figure 1A:
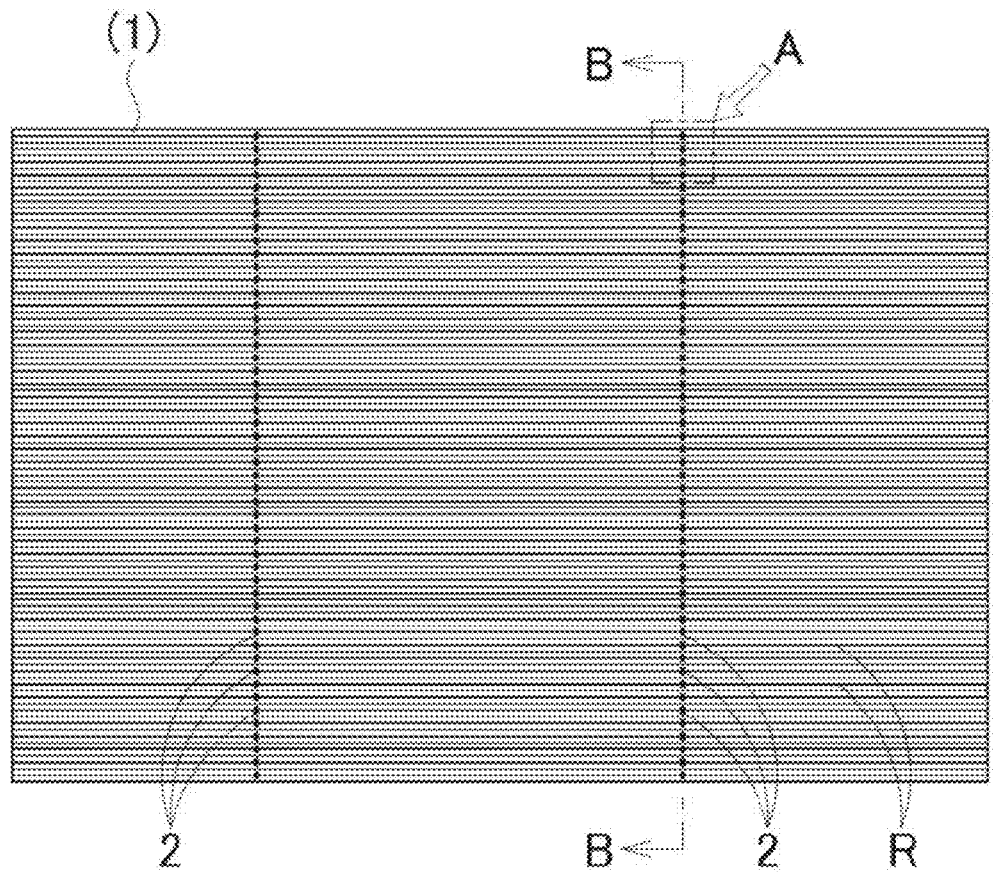
FIG. 1(a) is a plan view of an electromagnetic wave absorber showing a first embodiment of the present invention.

Hereinafter, embodiments of an electromagnetic wave absorber according to the present invention will be described in detail with reference to the accompanying drawings. Note that the embodiments described below are preferred specific examples for implementing the present invention, and hence various technical limitations have been made, but the present invention is not limited to the embodiments unless it is specifically stated in the description below that the invention is limited. Note that a numerical range indicated using the term "to" includes an upper limit and a lower limit.

As shown in FIGS. 1 to 4, the electromagnetic wave absorber is a structure formed by folding a sheet 1 into the form of pleats, that is, into a narrow-folded fold by regularly repeating mountain and valley folds.

The sheet 1 is a thin member containing a conductive material and having a surface resistance of 10 Ω/□ to 104 Ω/□. Thus, the sheet 1 has an absorption characteristic of a certain level or more for electromagnetic waves of 60 GHz to 120 GHz.

As the conductive material contained in the sheet 1, carbon materials such as carbon powders, like graphite, single-walled carbon nanotubes, multi-walled carbon nanotubes, and graphene, and carbon fiber can be used, and further, metal particles such as copper, silver, nickel, aluminum, and tin, metal foil pieces, and metal oxides such as tin oxide, indium oxide, and zinc oxide can also be used. The metal particles, metal foil pieces, and metal oxide described above can also be deposited on at least one surface of the sheet 1 and used. Among these, at least one material selected from the carbon materials such as the carbon powders, like graphite, single-walled carbon nanotubes, multi-walled carbon nanotubes, and graphene, and the carbon fiber is preferred. These carbon materials are light in weight, rarely deteriorate due to oxidation, and can be used stably for a long period of time.

The surface resistance of the sheet 1 is preferably 10 Ω/□ to 104 Ω/□, and more preferably 102 Ω/□ to 103 Ω/□. When the surface resistance of the sheet 1 is in this range, the sheet 1 does not reflect or transmit the incident electromagnetic waves of 60 GHz to 120 GHz to a large extent and has an absorption characteristic of a certain level or more.

In addition to the conductive material, various materials can be used as the material constituting the sheet 1. The material contained in the sheet 1 is preferably a fiber, a resin film, or the like. Among these fibers, vinylon fiber, polyester fiber, olefin fiber, polyphenylene sulfide fiber, and the like are preferred, and these can be used alone or in a combination of two or more. When the base material constituting the sheet 1 is such a fiber, the conductive material can be uniformly dispersed, so that the absorption characteristic hardly varies depending on the position of the sheet 1, and the electromagnetic waves of 60 GHz to 120 GHz can be absorbed stably.

The sheet 1 can also contain various other materials as needed. For example, various materials, such as a dispersant like a surfactant for more uniformly dispersing the conductive material in the sheet 1, a flame retardant for making the sheet 1 hard to burn, an antibacterial agent like a quaternary ammonium salt for preventing the growth of bacteria, and a colorant like a pigment for coloring the sheet 1 to a predetermined color, can be added to a fiber suspension used for wet papermaking in advance and contained in the sheet 1, or impregnated by spraying or the like after the preparation of the sheet 1 to be contained in the sheet 1.

The sheet 1 is prepared by a method such as wet papermaking in which the above-mentioned fiber and conductive material, as well as other additives and the like as needed, are blended and uniformly dispersed to adjust a fiber suspension, and the fiber suspension is dehydrated and dried in a paper machine equipped with a wire such as a circular mesh or a long rope to be formed as a sheet of paper.

The thickness of the prepared sheet 1 is preferably 100 μm to 500 μm, more preferably 200 μm to 400 μm. When the thickness of the sheet 1 is in this range, not only the sheet 1 does not reflect or transmit the incident electromagnetic waves of 60 GHz to 120 GHz to a large extent and has an absorption characteristic of a certain level or more, but also the sheet 1 can be reduced in weight and has an effect of being easily processed in a folding process or the like to be described later.

An adhesive layer containing an adhesive is preferably provided on the other surface of the sheet 1. The adhesive is preferably an acrylic adhesive such as an acrylic ester copolymer or a urethane adhesive such as a urethane resin. With the adhesive layer being provided, the electromagnetic wave absorber obtained by folding the sheet 1 into the form of pleats can be fixed to a device such as a millimeter wave radar.

Then, the sheet 1 thus obtained is folded into the form of pleats, that is, into a narrow-folded fold by regularly repeating mountain and valley folds, to produce an electromagnetic wave absorber. The sheet 1 is repeatedly folded to be formed into pleats, so that the electromagnetic waves of 60 GHz to 120 GHz reflected off the sheet 1 are attenuated and absorbed step by step by being absorbed by the sheet 1 each time as the reflection is repeated. In the present specification, the lines formed by mountain and valley folds are both referred to as ridgelines.

A height h between a ridgeline R formed on one surface of the sheet 1 and a ridgeline R formed on the other surface of the sheet 1 on the opposite side is preferably 0.5 to 15 mm, and more preferably 1 to 10 mm. When the height h between the ridgeline formed on one surface of the sheet 1 and the ridgeline R formed on the other surface of the sheet 1 on the opposite side is within this range, the electromagnetic waves of 60 GHz to 120 GHz can be absorbed, and the electromagnetic wave absorber can be easily installed even in a place where there is only a limited space, such as the interior of a vehicle body.

A folding angle α at which the sheet 1 is folded is preferably 10° to 45°, more preferably 20° to 40°. When the folding angle α at which the sheet 1 is folded is within this range, the electromagnetic waves of 60 GHz to 120 GHz can be absorbed efficiently.

The pitch width between one ridgeline R and an adjacent ridgeline R on the same side when the sheet 1 is repeatedly folded is preferably 0.5 to 5 mm, and more preferably 1 to 3 mm. When the pitch width between the adjacent ridgelines R on the surface on the same side is within this range, due also to the height between the ridgeline formed on one surface of the sheet 1 and the ridgeline R formed on the other surface of the sheet 1 on the opposite side, the electromagnetic waves of 60 GHz to 120 GHz can be absorbed, and the electromagnetic wave absorber can be easily installed even in a place where there is only a limited space, such as the interior of a vehicle body.

Figure 1B:
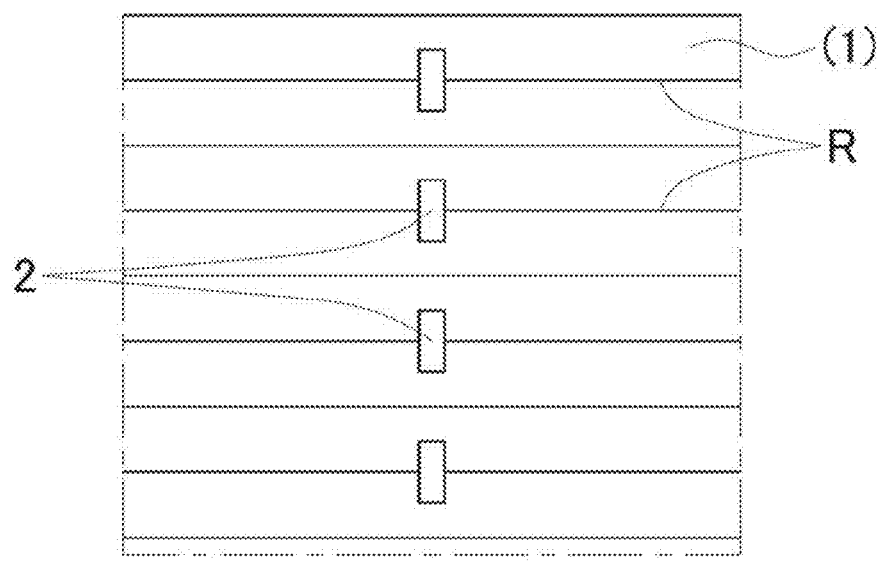
FIG. 1(b) is a partially enlarged view of FIG. 1(a).
Figure 2A:
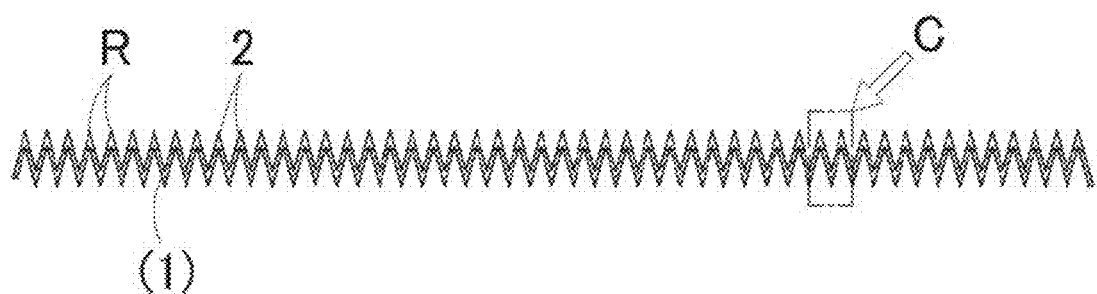
FIG. 2(a) is a cross-sectional view taken along line A-A of the electromagnetic wave absorber showing the first embodiment of the present invention.
Figure 2B:
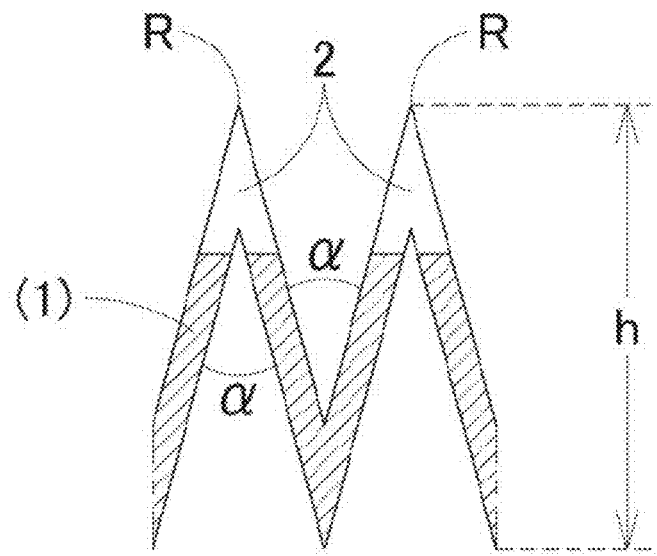
FIG. 2(b) is a partially enlarged view of FIG. 2(a).
Figure 3:
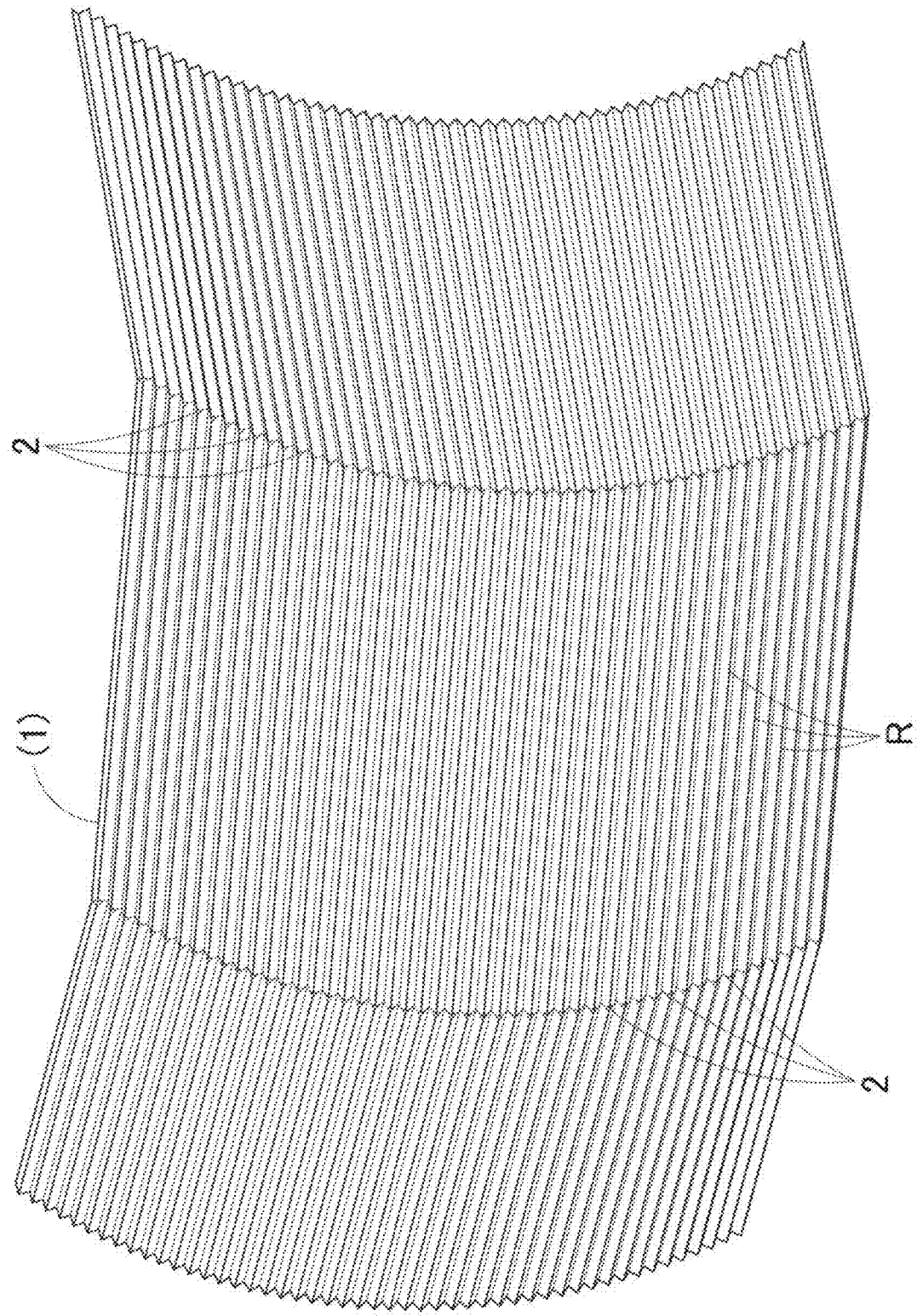
FIG. 3 is a reference view showing a state of use of the electromagnetic wave absorber showing the first embodiment of the present invention.
Figure 4:
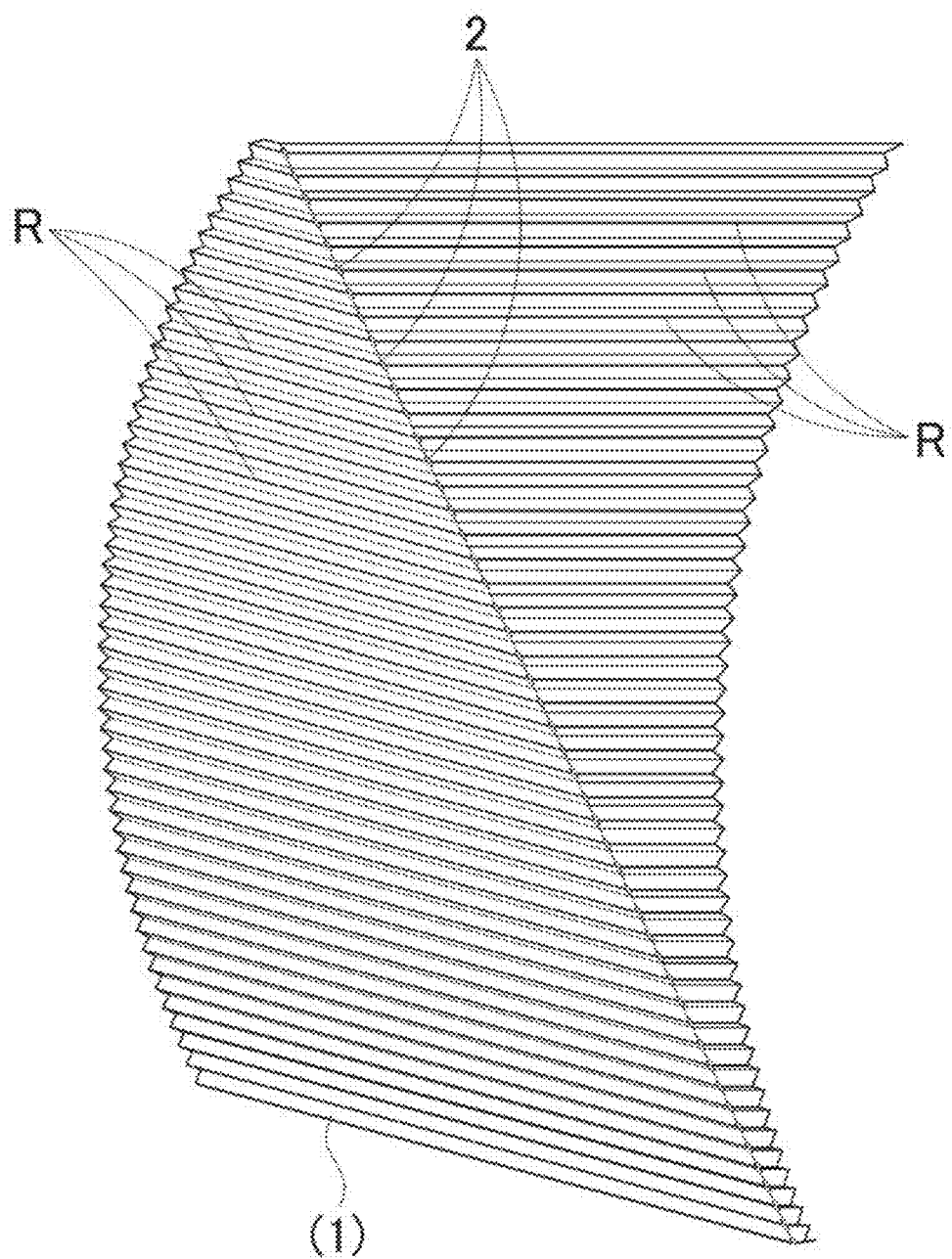
FIG. 4 is a reference view showing a state of use of the electromagnetic wave absorber showing a second embodiment of the present invention.

In the electromagnetic wave absorber, the ridgelines R obtained by folding the sheet 1 are provided with slits 2 not parallel to the ridgelines R. That is, the slits 2 are preferably formed so as to extend in a direction perpendicular to the ridgeline R or so as to extend in a direction oblique from the ridgeline R at a predetermined angle. More specifically, the slits 2 are preferably formed at an angle of 30° to 150° with respect to the ridgeline R. As shown in FIGS. 1 to 3, in the first embodiment, the slits 2 are formed so as to be substantially perpendicular to a plurality of ridgelines R formed on one surface of the sheet 1, and as shown in FIG. 4, in a second embodiment, the slits 2 are formed so as to be at an angle of about 45° to a plurality of ridgelines R formed on one surface of the sheet 1. In this way, the slits 2, which are not parallel to the ridgeline R, enable not only folding in the longitudinal direction of FIG. 1 due to the form of pleats, but also folding in the left-right direction of FIG. 1, so that the sheet 1 can be folded to be fit curved surfaces such as convex surfaces and concave surfaces in a plurality of directions. Therefore, the electromagnetic wave absorber can be easily installed even in a millimeter wave radar enclosure or a place where there is only a limited space, such as the interior of a vehicle body. The slit 2 is formed as a cut using a cutting tool, or an elongated gap is perforated. In the first and second embodiments, the slits 2 are provided continuously one by one over a plurality of ridgelines R formed on one surface of the sheet 1, but the slits 2 may be provided discontinuously such as skipping one or two of the plurality of ridgelines R depending on the curvature of the curved surface for attachment. Moreover, although the slits 2 are provided in a straight line in the first embodiment and the second embodiment, the slits 2 may be provided in a curved line so long as the electromagnetic wave absorber can be installed in a device or a space of an attachment target.

Hereinafter, the first embodiment of the present invention will be described specifically. Note that the present invention is not limited to the following examples.

Reference Examples 1 to 24

First, flat sheets 1 having various surface resistances were prepared. Specifically, a plurality of sheets 1 with a thickness of 300 μm were prepared by wet papermaking using vinylon fiber as a fiber and multi-walled carbon nanotubes (5 to 20 wt % of the vinylon fiber) as a conductive material. The surface resistance of each of these prepared sheets 1 was measured with a surface resistance measuring instrument (model number: Loresta GX MCP-T700, manufactured by Nittoseiko Analytech Co., Ltd.). For each of these sheets 1, the reflection amount and the transmission amount of incident electromagnetic waves having a frequency of 79 GHz were measured with an electromagnetic wave absorption measuring device (free space method, Japan Fine Ceramics Center), and from those pieces of data, a reflectance, a transmittance, and an absorptance were calculated. Specifically, the reflectance was calculated from the formula of reflectance (%)=(10(reflection amount/20))2×100, the transmittance was calculated from the formula of transmittance (%)=(10(transmission amount/20))2×100, and the absorptance was calculated from the formula of absorptance (%)=100−reflectance (%)−transmittance (%).

Figure 5:
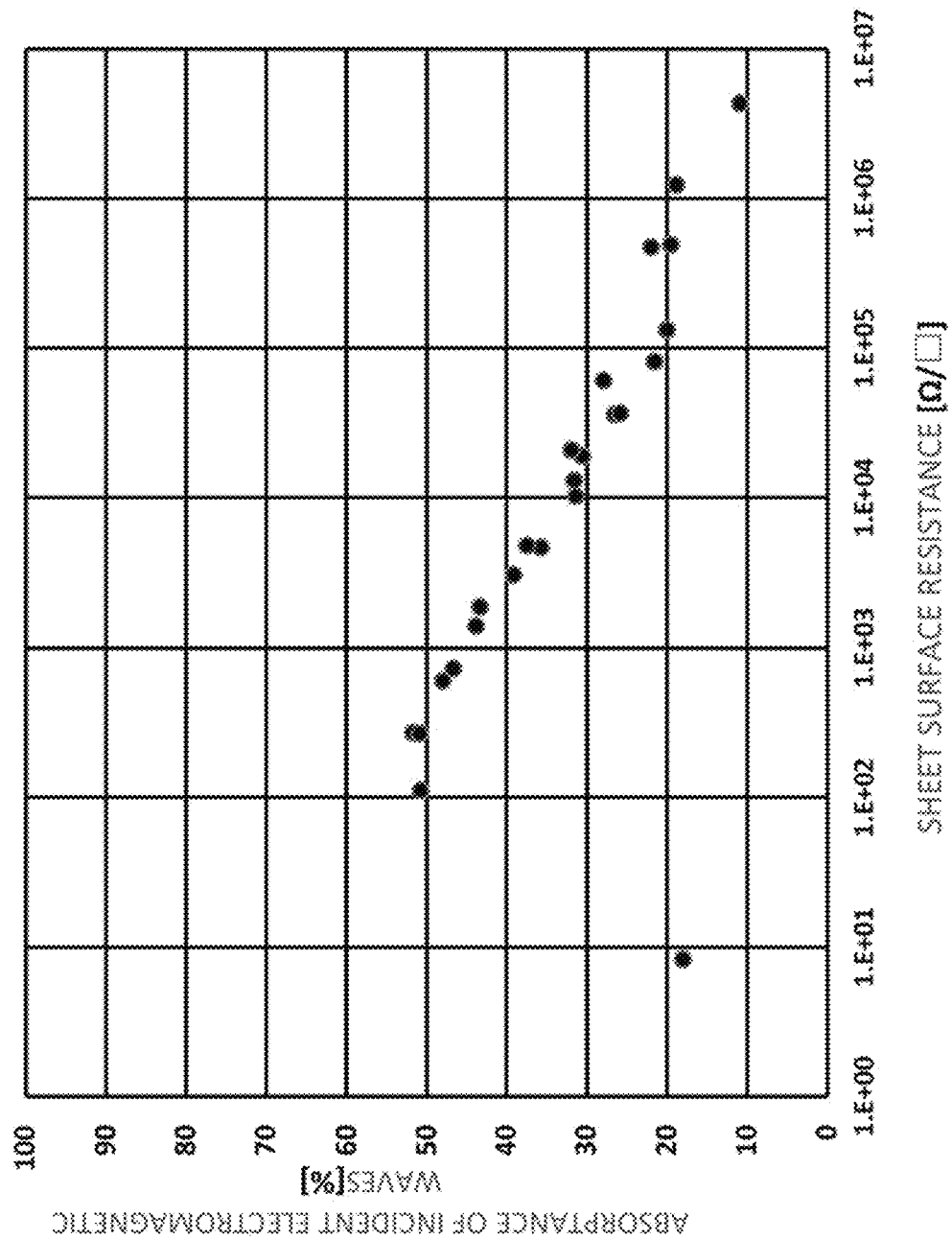
FIG. 5 is a graph representing an electromagnetic wave absorption characteristic of a sheet.

The results are shown in Table 1, and the relationship between the surface resistance and the absorptance is shown in FIG. 5. From these results, a sheet having a surface resistance of 10 Ω/□ to 104 Ω/□ was determined as good since showing an electromagnetic wave absorptance of 35% or more at the flat sheet stage, and a sheet out of the above range, having an electromagnetic wave absorptance of less than 35% at the flat sheet stage, was determined as defective.

TABLE 1

| | Surface resistance [Ω/□] | Reflection amount [dB] | Transmission amount [dB] | Reflection amount [%] | Transmittance [%] | Absorptance [%] |
|---|---|---|---|---|---|---|
| Reference Example 1 | 8.25E+00 | −0.867 | −39.854 | 81.9 | 0.0 | 18.1 |
| Reference Example 2 | 1.11E+02 | −3.981 | −10.359 | 40.0 | 9.2 | 50.8 |
| Reference Example 3 | 2.71E+02 | −5.131 | −7.559 | 30.7 | 17.5 | 51.8 |
| Reference Example 4 | 2.67E+02 | −5.258 | −7.149 | 29.8 | 19.3 | 50.9 |
| Reference Example 5 | 6.01E+02 | −5.257 | −6.543 | 29.8 | 22.2 | 48.0 |
| Reference Example 6 | 7.23E+02 | −6.939 | −4.803 | 20.2 | 33.1 | 46.7 |
| Reference Example 7 | 1.38E+03 | −8.048 | −3.930 | 15.7 | 40.5 | 43.9 |
| Reference Example 8 | 1.85E+03 | −8.040 | −3.878 | 15.7 | 40.9 | 43.3 |
| Reference Example 9 | 3.03E+03 | −9.430 | −3.063 | 11.4 | 49.4 | 39.2 |
| Reference Example 10 | 4.61E+03 | −9.791 | −2.697 | 10.5 | 53.7 | 35.8 |
| Reference Example 11 | 4.73E+03 | −9.482 | −2.904 | 11.3 | 51.2 | 37.5 |
| Reference Example 12 | 1.02E+04 | −11.945 | −2.064 | 6.4 | 62.2 | 31.4 |
| Reference Example 13 | 1.30E+04 | −12.465 | −2.027 | 5.7 | 62.7 | 31.6 |
| Reference Example 14 | 1.90E+04 | −11.206 | −2.090 | 7.6 | 61.8 | 30.6 |
| Reference Example 15 | 2.08E+04 | −11.326 | −2.170 | 7.4 | 60.7 | 32.0 |
| Reference Example 16 | 3.59E+04 | −13.066 | −1.647 | 4.9 | 68.4 | 26.6 |
| Reference Example 17 | 3.65E+04 | −12.142 | −1.677 | 6.1 | 68.0 | 25.9 |
| Reference Example 18 | 6.04E+04 | −11.168 | −1.913 | 7.6 | 64.4 | 28.0 |
| Reference Example 19 | 8.09E+04 | −13.918 | −1.289 | 4.1 | 74.3 | 21.6 |
| Reference Example 20 | 1.32E+05 | −14.258 | −1.183 | 3.8 | 76.1 | 20.1 |
| Reference Example 21 | 4.68E+05 | −13.350 | −1.349 | 4.6 | 73.3 | 22.1 |
| Reference Example 22 | 4.89E+05 | −13.370 | −1.203 | 4.6 | 75.8 | 19.6 |
| Reference Example 23 | 1.23E+06 | −14.272 | −1.117 | 3.7 | 77.3 | 18.9 |
| Reference Example 24 | 4.31E+06 | −15.967 | −0.629 | 2.5 | 86.5 | 11.0 |

Then, an electromagnetic wave absorber was produced by folding the sheet 1 into the form of pleats, the sheet 1 having been prepared by wet papermaking using, as raw materials, vinylon fiber as the fiber and multi-walled carbon nanotubes (10 wt % of the vinylon fiber) as the conductive material, with a basis weight of 100 g/m$^2$, a thickness of 300 μm, and a surface resistance of 130 Ω/□. Specifically, the sheet 1 was folded such that the height h was 2 mm and the folding angle was 10 to 15°, to produce a pleated electromagnetic wave absorber as shown in FIG. 1. The slits 2 were formed by being cut with a cutting tool so as to extend in the perpendicular direction to the ridgeline R formed on the sheet 1. As described above, the slits 2 enable not only folding in the longitudinal direction of FIG. 1 due to the form of pleats but also folding in the left-right direction of FIG. 1, so that the sheet 1 can be folded to fit curved surfaces such as convex surfaces and concave surfaces in a plurality of directions.

Figure 6:
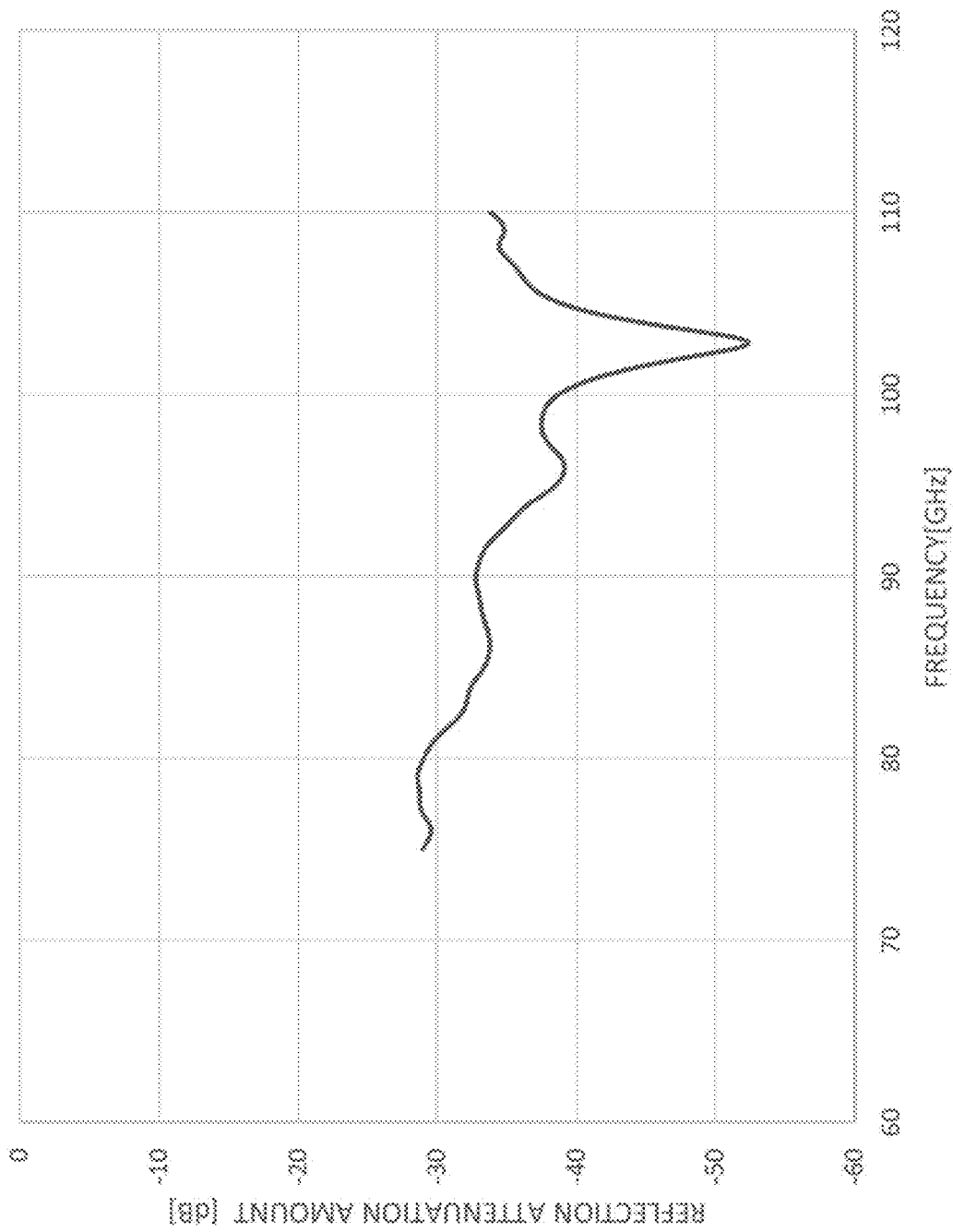
FIG. 6 is a graph representing an electromagnetic wave absorption characteristic in the electromagnetic wave absorber showing the first embodiment of the present invention.

Then, in a state where the slits 2 traversing the ridgelines R as shown in FIG. 3 were also folded, the slits 2 and therearound were irradiated with electromagnetic waves of a predetermined frequency to measure an electromagnetic wave absorption characteristic in the millimeter wave band by the free space method based on JIS R1679:2007. Specifically, the reflection attenuation amount was measured by performing irradiation with electromagnetic waves with a frequency of 75 to 110 GHz using an electromagnetic wave absorption measuring device (free space method, Japan Fine Ceramics Center). The results are shown in FIG. 6.

The relationship between the absorptance and the amount of reflection attenuation of the incident electromagnetic waves is expressed as: absorptance (%)=100−reflectance (%)=$(1-(10^{(amount\ of\ reflection\ attenuation/20)})^2) \times 100$, and when the reflection attenuation amount is −30 dB, −40 dB, and −50 dB, the absorptance of the electromagnetic waves is 99.9%, 99.99%, and 99.999%, respectively. Therefore, it was found from the results in FIG. 6 that 99.86% (−28.5 dB) or more of electromagnetic waves having a frequency of 75 to 110 GHz can be absorbed in the present example.

Therefore, it was found that electromagnetic waves having a frequency of 75 to 110 GHz can be absorbed sufficiently in an electromagnetic wave absorber that is a structure formed by folding the sheet 1 into the form of pleats, the sheet 1 containing a conductive material and having a predetermined surface resistance, in which the slits 2 perpendicular to the folded ridgeline R are perforated. The electromagnetic wave absorber can be installed on various curved surfaces such as a convex surface and a concave surface.

REFERENCE SIGNS LIST

1 sheet
2 slit
R ridgeline
h height
α folding angle

The invention claimed is:

1. An electromagnetic wave absorber that is a structure formed by folding a sheet into a form of pleats, the sheet containing a conductive material and having a surface resistance of 10Ω/□ to 10$^4$Ω/□, wherein slits are perforated non-parallel to a folded ridgeline, wherein the sheet has a thickness of 100 μm to 500 μm, and wherein a height between the ridgeline formed on one surface of the sheet and the ridgeline formed on the other surface of the sheet on an opposite side is 0.5 mm to 15 mm, and a folding angle of the sheet is 10° to 45°.

2. The electromagnetic wave absorber according to claim 1, wherein the slits are formed in a direction perpendicular or oblique to the ridgeline.

3. The electromagnetic wave absorber according to claim 1, wherein a fiber contained in the sheet is at least one selected from vinylon fiber, polyester fiber, olefin fiber, and polyphenylene sulfide fiber.

4. The electromagnetic wave absorber according to claim 1, wherein the conductive material is at least one material selected from graphite, single-walled carbon nanotubes, multi-walled carbon nanotubes, graphene, and carbon fiber.

5. The electromagnetic wave absorber according to claim 1, wherein an adhesive layer made of an adhesive is provided on the other surface of the sheet.

6. The electromagnetic wave absorber according to claim 2, wherein a fiber contained in the sheet is at least one selected from vinylon fiber, polyester fiber, olefin fiber, and polyphenylene sulfide fiber.

7. The electromagnetic wave absorber according to claim 2, wherein the conductive material is at least one material selected from graphite, single-walled carbon nanotubes, multi-walled carbon nanotubes, graphene, and carbon fiber.

8. The electromagnetic wave absorber according to claim 2, wherein an adhesive layer made of an adhesive is provided on the other surface of the sheet.

9. The electromagnetic wave absorber according to claim 3, wherein an adhesive layer made of an adhesive is provided on the other surface of the sheet.

* * * * *